(12) United States Patent
Weng et al.

(10) Patent No.: US 9,978,915 B2
(45) Date of Patent: May 22, 2018

(54) MANUFACTURING METHOD OF A FLIP-CHIP LIGHT EMITTING DIODE PACKAGE MODULE

(71) Applicants: LITE-ON ELECTRONICS (GUANGZHOU) LIMITED, Guangzhou (CN); LITE-ON TECHNOLOGY CORPORATION, Taipei (TW)

(72) Inventors: Ming-Kun Weng, New Taipei (TW); Meng-Sung Chou, New Taipei (TW)

(73) Assignees: LITE-ON ELECTRONICS (GUANGZHOU) LIMITED, Guangzhou (CN); LITE-ON TECHNOLOGY CORPORATION, Taipei (TW)

( * ) Notice: Subject to any disclaimer, the term of this patent is extended or adjusted under 35 U.S.C. 154(b) by 0 days. days.

(21) Appl. No.: 15/287,233

(22) Filed: Oct. 6, 2016

(65) Prior Publication Data
US 2017/0025588 A1    Jan. 26, 2017

Related U.S. Application Data

(62) Division of application No. 14/292,896, filed on May 31, 2014, now Pat. No. 9,490,404.

(30) Foreign Application Priority Data

Jul. 8, 2013  (CN) .......................... 2013 1 0285015

(51) Int. Cl.
*H01L 33/54* (2010.01)
*H01L 33/62* (2010.01)
(Continued)

(52) U.S. Cl.
CPC .............. *H01L 33/54* (2013.01); *H01L 24/97* (2013.01); *H01L 25/0753* (2013.01);
(Continued)

(58) Field of Classification Search
CPC ..... H01L 33/54; H01L 33/0095; H01L 33/44; H01L 33/507; H01L 33/58; H01L 33/62; H01L 33/508; H01L 25/0753
See application file for complete search history.

(56) References Cited

U.S. PATENT DOCUMENTS

2010/0163892 A1* 7/2010 Liu ...................... H05K 1/0274
257/89
2011/0031526 A1    2/2011 Han et al.

FOREIGN PATENT DOCUMENTS

| CN | 102280562 A | 12/2011 |
| CN | 104094424 A | 10/2014 |
| JP | 200847832 A | 2/2008 |

* cited by examiner

*Primary Examiner* — (Vikki) Hoa B Trinh
(74) *Attorney, Agent, or Firm* — Li & Cai Intellectual Property (USA) Office

(57) ABSTRACT

The instant disclosure relates to a flip-chip LED package module and a method of manufacturing thereof. The method of manufacturing flip-chip LED package module comprises the following steps. A plurality of LEDs is disposed on a carrier. A packaging process is forming a plurality of transparent lens corresponding to LEDs and binding each other by a wing portion. A separating process is proceeding to form a plurality of flip-chip LED structures without the carrier. A bonding process is proceeding to attach at least one flip-chip LED structure on the circuit board.

20 Claims, 18 Drawing Sheets

(51) Int. Cl.
*H01L 23/00* (2006.01)
*H01L 25/075* (2006.01)
*H01L 33/00* (2010.01)
*H01L 33/44* (2010.01)
*H01L 33/58* (2010.01)
*H01L 33/50* (2010.01)

(52) U.S. Cl.
CPC .......... *H01L 33/0095* (2013.01); *H01L 33/44* (2013.01); *H01L 33/507* (2013.01); *H01L 33/58* (2013.01); *H01L 33/62* (2013.01); *H01L 33/508* (2013.01); *H01L 2224/16225* (2013.01); *H01L 2924/01322* (2013.01); *H01L 2924/12041* (2013.01); *H01L 2924/12042* (2013.01); *H01L 2924/15747* (2013.01); *H01L 2924/15787* (2013.01); *H01L 2933/005* (2013.01); *H01L 2933/0025* (2013.01); *H01L 2933/0033* (2013.01); *H01L 2933/0041* (2013.01); *H01L 2933/0058* (2013.01); *H01L 2933/0066* (2013.01)

MANUFACTURING METHOD OF A FLIP-CHIP LIGHT EMITTING DIODE PACKAGE MODULE

CROSS REFERENCE TO RELATED APPLICATION

This application is a divisional application of U.S. application Ser. No. 14/292,896, filed on May 31, 2014, and entitled "FLIP-CHIP LIGHT EMITTING DIODE PACKAGE MODULE AND MANUFACTURING METHOD THEREOF", the entire contents of which are hereby incorporated by reference.

BACKGROUND OF THE INVENTION

1. Field of the Invention

The present disclosure relates to a light emitting diode (LED) package module and a manufacturing method thereof; in particular, to a manufacturing method of a flip-chip LED package module.

2. Description of Related Art

Traditional LED packages need to use ceramic substrates as LED package carriers to transfer heat from the chips to the circuit board via good thermal conductivity of the carrier. Referring to FIG. 1, an LED chip 10' is fixed onto a ceramic substrate 12' by chip fixing glue 11', and is enclosed by package material 18'. The substrate 12' is fixed by solder 13' to a printed circuit board formed by an aluminum layer 15' and an insulation layer 14'. By this structural design, heat produced by the LED chip 10' is transferred in the direction of the arrow.

Therefore, the traditional LED package structure is, layer by layer from top to bottom, an LED chip, chip fixing glue, substrate, solder and printed circuit board. However, a plurality of layers implies a plurality of heat resistance. Namely, heat resistance is increased due to the increased thickness of the LED package structure, leading to problems in heat dissipation.

Hence, the present disclosure provides reasonable design of LED package structure to overcome these problems effectively.

SUMMARY OF THE INVENTION

The object of the present disclosure is to provide a flip-chip light emitting diode (LED) package module and a manufacturing method thereof, for eliminating a substrate which chip packaged and simplifying the manufacturing method of the LED package module.

In order to achieve the aforementioned objects, the present disclosure provides a method of manufacturing a flip-chip LED package module, comprising the following steps: disposing a plurality of LED chips on a carrier; a packaging process, forming a plurality of transparent packages connected with each other and respectively enclosing the LED chips; a separating process, separating the transparent packages from each other to form a plurality of single flip-chip LED structures without the carrier; and a bonding process, bonding at least a flip-chip LED structure to a circuit board.

In order to further the understanding regarding the present disclosure, the following embodiments are provided along with illustrations to facilitate the disclosure of the present disclosure.

DETAILED DESCRIPTION OF THE PREFERRED EMBODIMENTS

Figure 1:
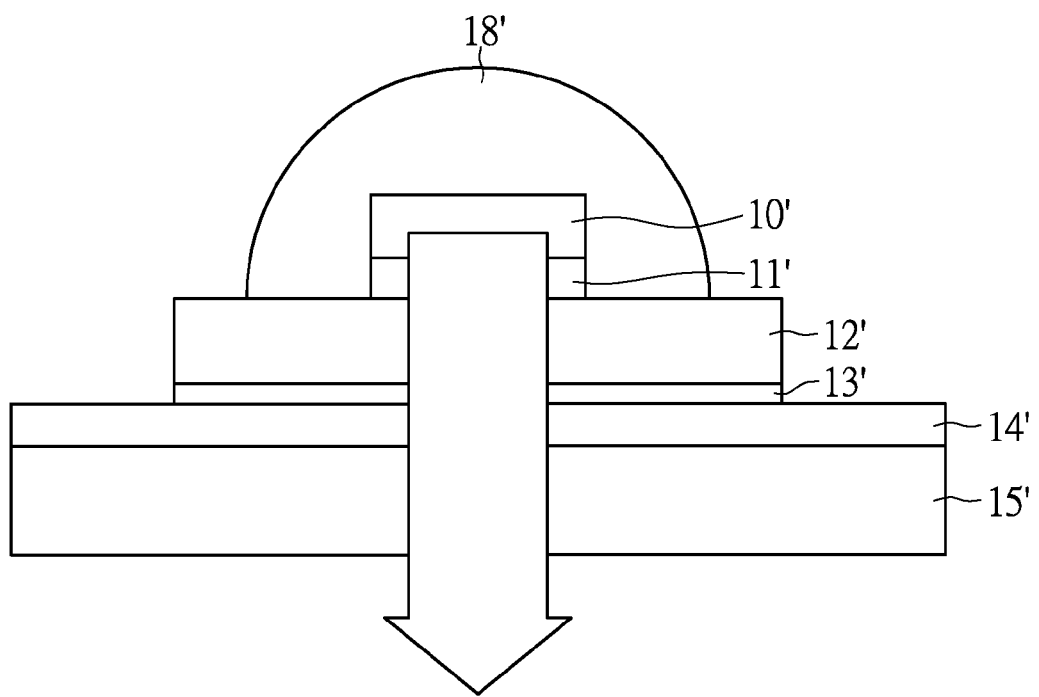
FIG. 1 shows a schematic diagram of a conventional LED chip.
Figure 2A:
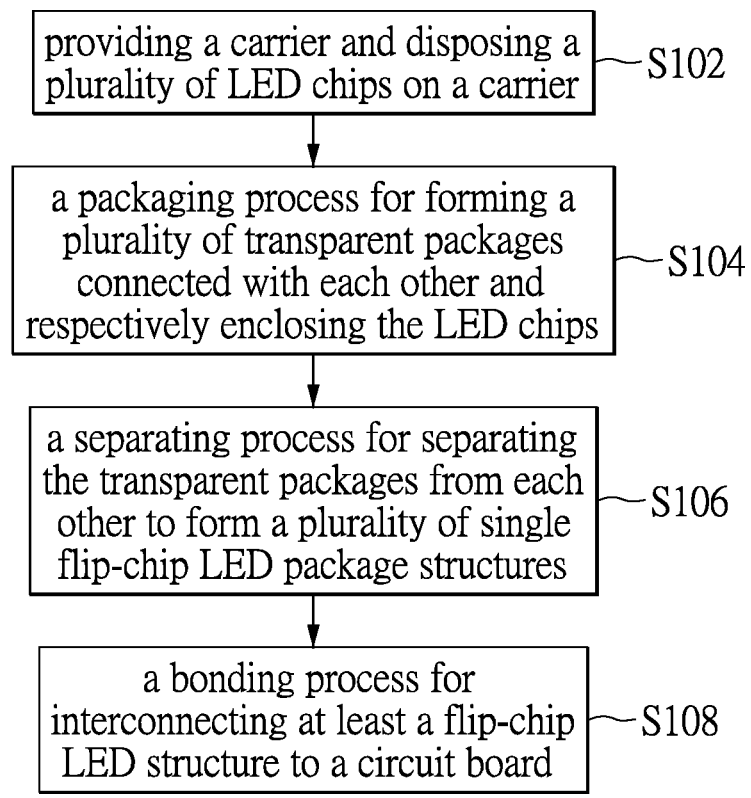
FIG. 2A shows a flowchart of the production method of a flip-chip LED package module according to the present disclosure (1)
Figure 2B:
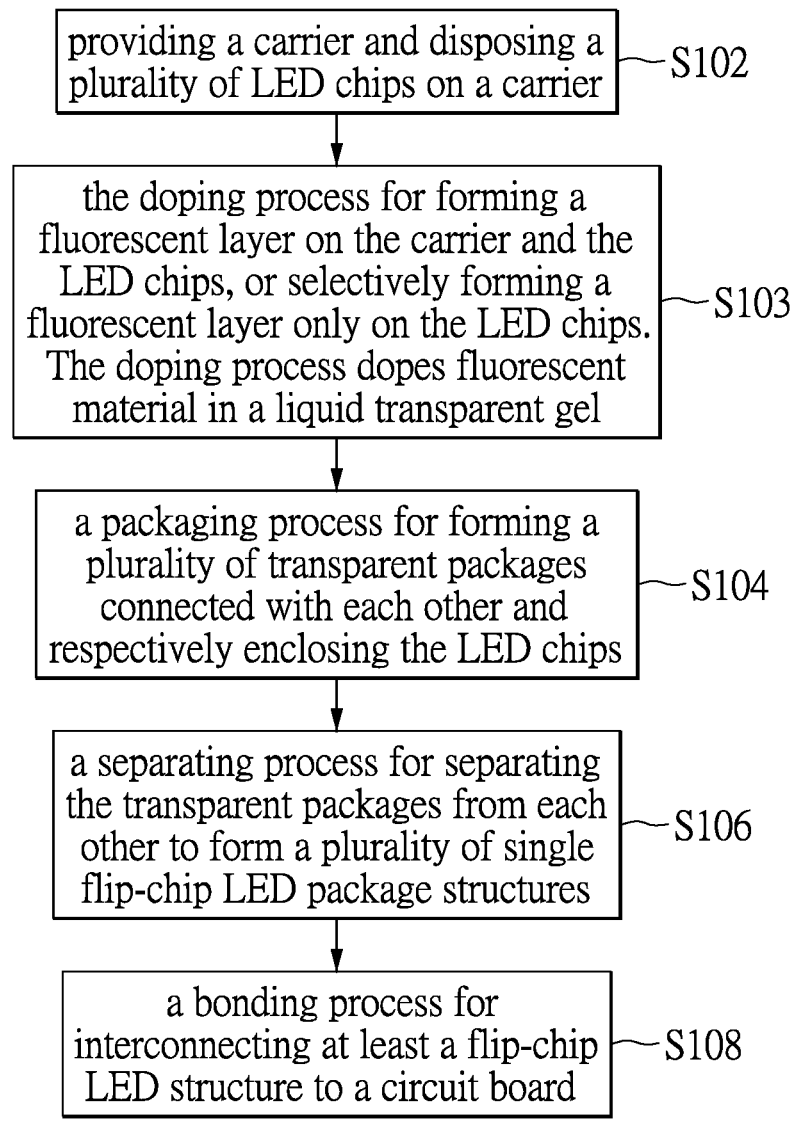
FIG. 2B shows a flowchart of the production method of a flip-chip LED package module according to the present disclosure (2)

The aforementioned illustrations and following detailed descriptions are exemplary for the purpose of further explaining the scope of the present disclosure. Other objectives and advantages related to the present disclosure will be illustrated in the subsequent descriptions and appended drawings.

Additionally, language describing the direction in the present disclosure such as upper, bottom, left, right, front, rear, etc. merely reference the direction of the figures. Therefore, the language describing directions are not meant to limit the present disclosure.

Unless otherwise specified, the present disclosure is not limited to the amounts, quantities or the like indicated in the following description. The method of manufacturing the flip-chip LED package module without supporting substrate of present disclosure is applicable for connecting LED chips directly to a printed circuit board (PCB), metal core PCB (MCPCB), ceramic substrate and direct bond copper substrate (DBC), but the present disclosure is not limited thereto.

Referring to FIG. 2A to FIG. 6, in the present embodiment, during the manufacture of the flip-chip LED package module 100 of the present disclosure, a plurality of LED chips 2 disposed on a temporary carrier 200 is packaged simultaneously and then separated to form single flip-chip LED package structures 300 each having a LED chip 2 and a transparent package 3.

Please refer to FIG. 2A and FIGS. 3A-3C. In the present embodiment, as described in step S102, the plurality of LED chips 2 is disposed on the temporary carrier 200 in an array. The positions of the arranged LED chips 2 have predetermined distances therebetween greater than or equal to 40% of the length of the diagonal of each of the LED chips 2, or when the transparent packages 3 and the neighboring wing portions 32 are of level height, the positions of the arranged LED chips 2 have predetermined distances therebetween greater than 0.1 millimeter. Additionally, the temporary carrier 200 can have adhesive property on one or both sides, so the LED chips 2 can be directly disposed on the adhesive surface of the temporary carrier 200 to provide temporary fixture for the LED chips 2 and facilitate subsequent manufacturing processes. Each of the LED chips 2 has a surrounding lateral surface 21, a first surface 22 and a second surface 23 opposite the first surface 22. The lateral surface 21 is joined to the first surface 22 and the second surface 23. Each of the second surfaces 23 of the LED chips 2 has at least a pair of chip metalized pads 24, and the pair of chip metalized pads 24 has a gap P therebetween. Each of the LED chips 2 is attached to the surface of the temporary carrier 200 via the pair of chip metalized pads 24 facing downward. The contact point 24a between the upper surface 202 of the temporary carrier 200 and the P-contact pad is at the same level as the contact point 24a between the upper surface 202 of the temporary carrier 200 and the N-contact pad. Namely, the upper surface 202, the contact point 24a between the upper surface 202 and the P-contact pad, and the contact point 24a between the upper surface 202 and the N-contact pad lie in the same horizontal plane.

Figure 3A:
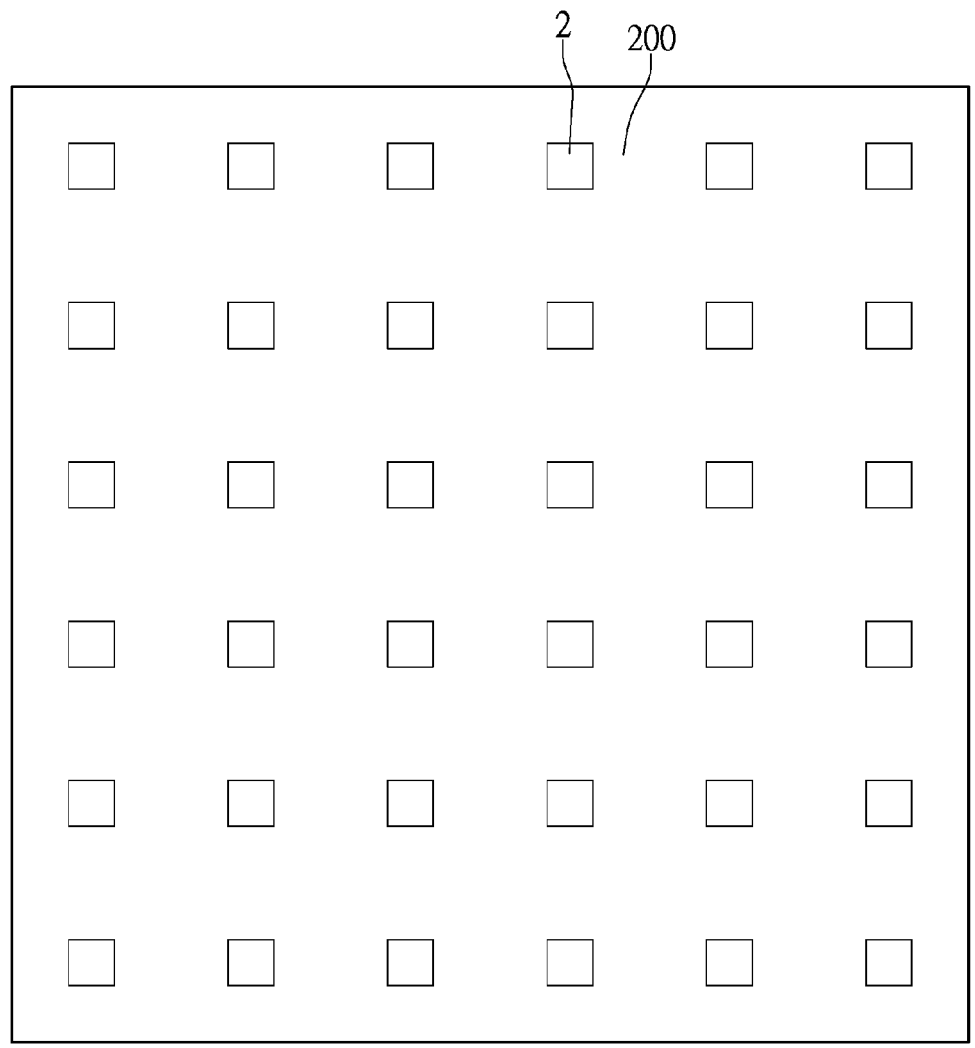
FIG. 3A shows a schematic diagram of LED chips disposed on a carrier according to the present disclosure.
Figure 3B:
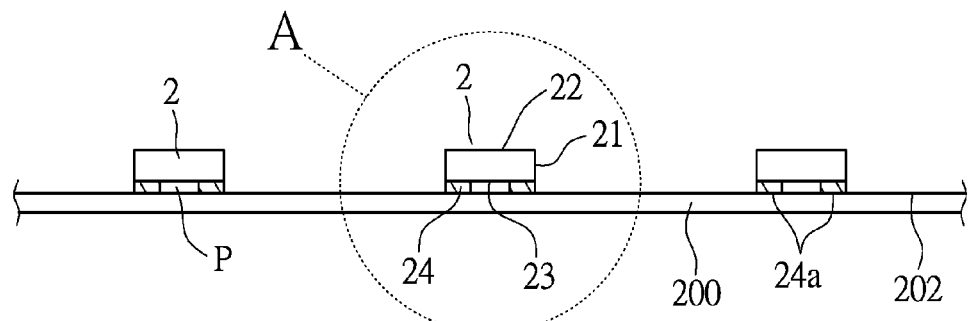
FIG. 3B shows a side view of LED chips disposed on a carrier according to the present disclosure.
Figure 3C:
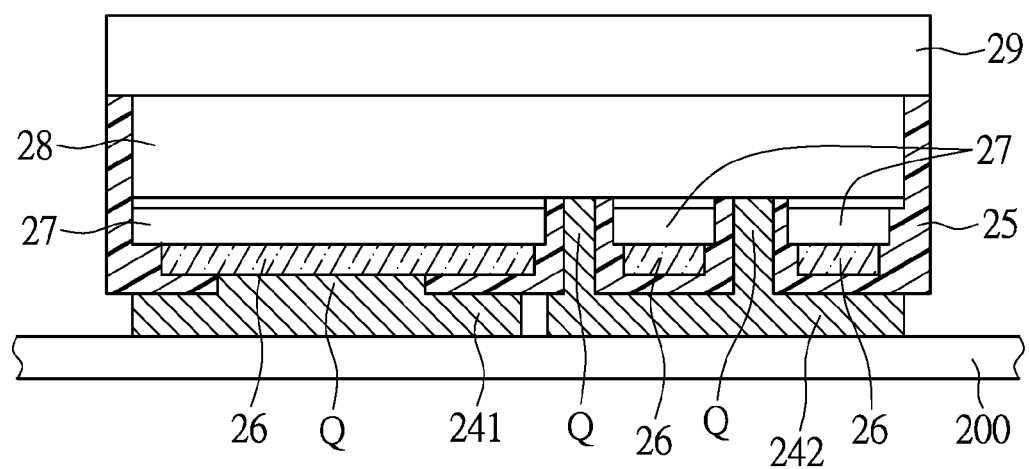
FIG. 3C shows an enlarged view of portion A in FIG. 3B.

Additionally, as shown in FIG. 3C, an enlarged view of portion A in FIG. 3B, the lateral surface 21 is preferably formed with a lateral wall protection layer 25 (a dielectric material such as silicon oxide (SiOx) or aluminum oxide), to prevent damage of the LED chips 2 due to the subsequent packaging process. In practice, the pair of chip metalized pads 24 can be respectively a P-contact pad 241 and an N-contact pad 242. The lateral wall protection layer 25 can extend onto the second surface 23, namely forming an electrical insulation layer between the P-contact pad 241 and the N-contact pad 242 and the LED chip 2, while providing at least one opening Q to a P-type semiconductor layer 27 and a corresponding N-type semiconductor layer 28 individually, such that the P-contact pad 241 and the N-contact pad 242 are respectively and electrically connected to the P-type semiconductor layer 27 and the N-type semiconductor layer 28 via respective openings Q. Since the insulation layer above the P-contact pad 241 and the N-contact pad 242 effectively and electrically separates P and N in subsequent manufacture processes of the P-contact pad 241 and the N-contact pad 242, instances of poor yield of conducting structures (P-contact pad 241 and N-contact pad 242) due to structures (gap distance, height difference, etc.) of neighboring P-type semiconductor layer 27 and N-type semiconductor layer 28 are reduced. Additionally, when viewing the FIG. 3C upside-down, it can be clearly observed that a mirror layer 26 for increasing the luminance (such as ITO plus silver or pure silver) is below the insulation layer, positioned above the P-type semiconductor layer 27 and below the respective orthogonal projections of the P-contact pad 241 and the N-contact pad 242, wherein the surface area of the mirror layer 26 is preferably slightly smaller than the P-type semiconductor layer 27.

Figure 4A:
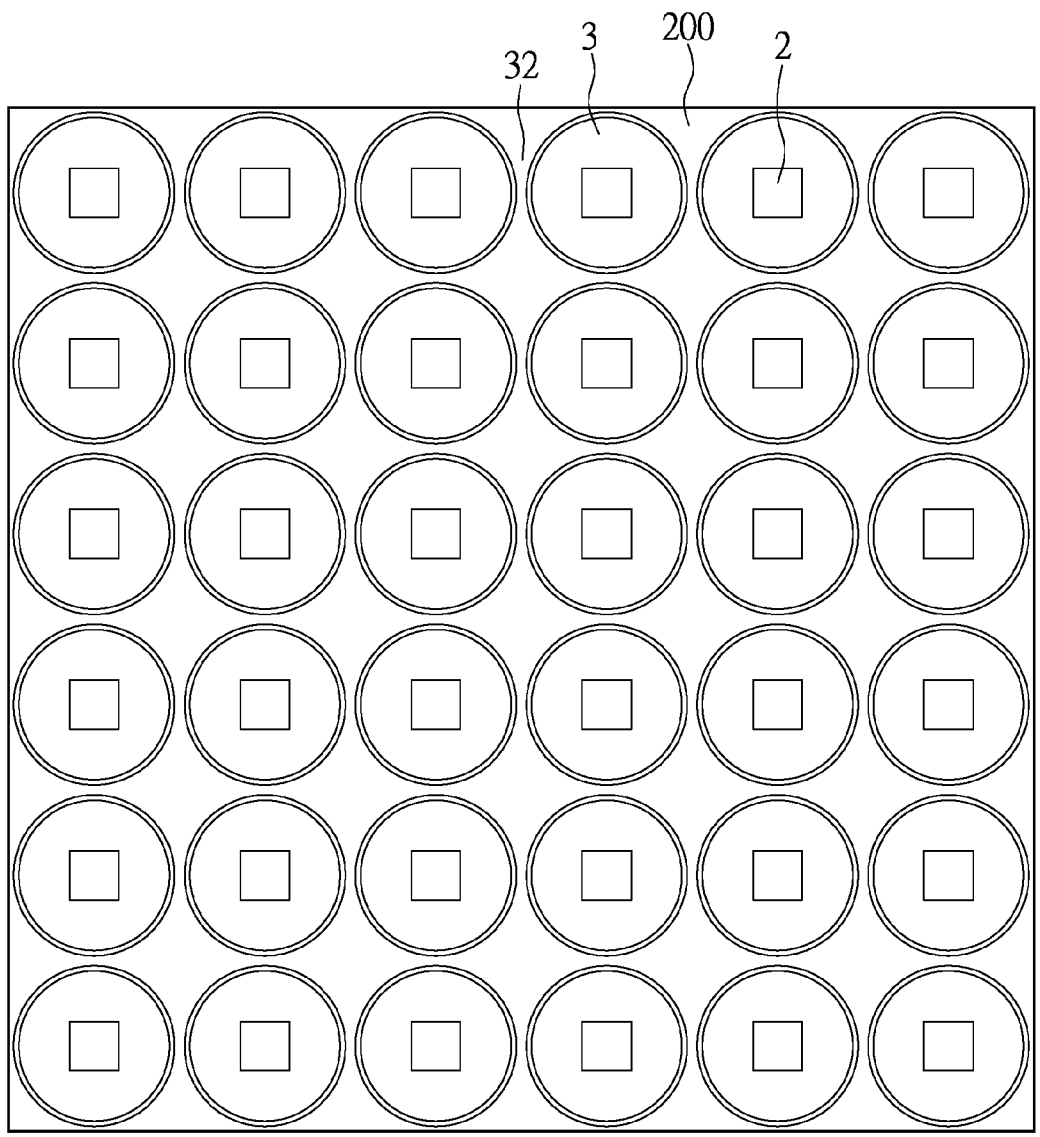
FIG. 4A shows a schematic diagram of transparent packages formed on LED chips according to the present disclosure.
Figure 4B:
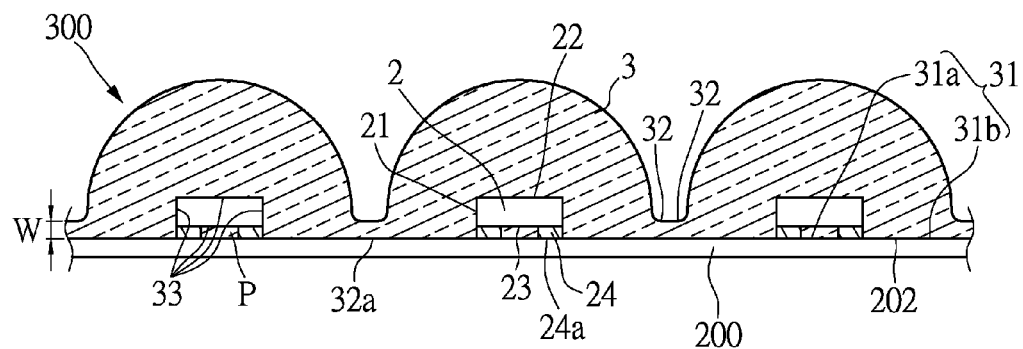
FIG. 4B shows a side view of transparent packages formed on LED chips according to the present disclosure.

Then, as described per step S104, a packaging process forms a plurality of transparent packages 3 corresponding to the LED chips 2 and enclosing thereof as shown in FIGS. 4A and 4B. The present embodiment packages the LED chips 2 through molding to form a plurality of mutually connected flip-chip LED package structures 300. Gel injection or dispensing is also a way to form the plurality of mutually connected flip-chip LED package structures 300.

Specifically, the LED chips are disposed inside a mold (not shown in the figures) having a plurality of predetermined shape of mold cavities (not shown in the figures) such that the mold cavities respectively correspond to the LED chips 2. The predetermined shape of mold cavities can be spherical, water-drop-shaped, square, disc-shaped, or conical dependent on optical requirement. The shape of the mold cavities is not limited. Differently predetermined shaped mold cavities form differently and correspondingly predetermined shaped transparent packages 3. In the present embodiment, the predetermined shape of mold cavities is concave, spherical preferably, thus the shape of transparent packages 3 is convex, curved or rounded preferably.

Then, liquid transparent gel is injected into the mold cavities. The depth of the mold cavities is greater than the height of the LED chips 2. Referring to FIG. 4B, the mold cavities (not shown in the figure) and the carrier 200 have a smallest distance W therebetween (namely the thickness W of wing portions 32), and the external contact points 24a of any two chip metalized pads 24 are coplanar with the upper surface 202 of the carrier 200, therefore the liquid transparent gel can freely flow between the two chip metalized pads 24 and fill in a gap P. In other words, the liquid transparent gel encloses the two chip metalized pads 24 such that the liquid transparent gel completely encloses the periphery of the LED chip 2. More specifically, the liquid transparent gel completely encloses the surrounding lateral surface 21, the first surface 22 and the second surface 23, and becomes one body with the LED chip 2 the liquid transparent gel mainly encloses the first surface 22 (main light emission surface) and the surrounding lateral surface 21, and the liquid transparent gel encloses the second surface 23 so that the liquid transparent gel firmly holds the LED chip 2 in place. Additionally, the liquid transparent gel can form between the LED chips 2 non-hardened wing portions 32, such that the LED chips 2 are mutually connected by the non-hardened wing portions 32. In the packaging process, a flat bottom surface 31 of the transparent packages 3 is formed coplanar with a contact point 24a of each of the chip metalized pads 24, the upper surfaces 202 of the carrier 200.

Figure 4C:
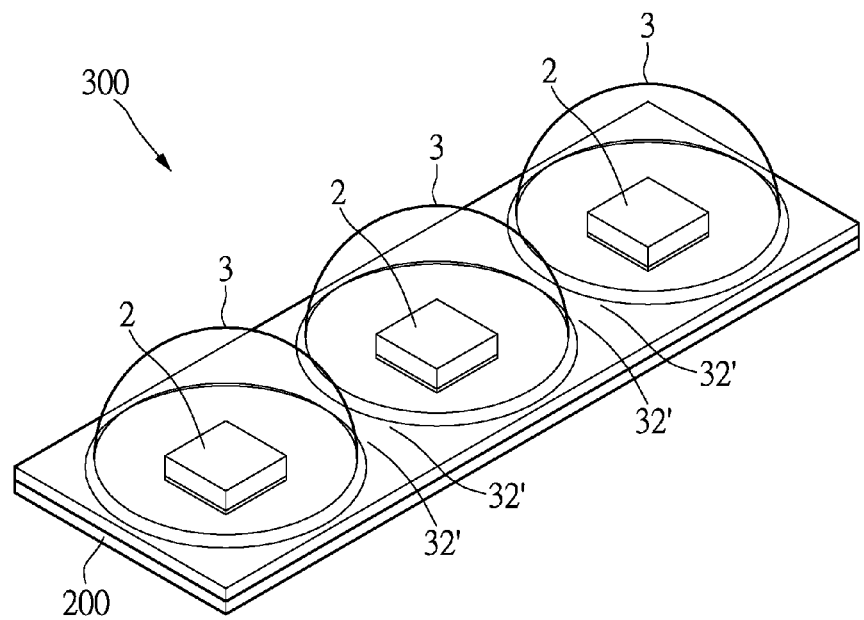
FIG. 4C shows a perspective view of flip-chip LED package structure according to the present disclosure.

Afterwards, a curing step can be carried out such that the liquid transparent gel hardens and becomes the transparent packages 3. The transparent packages 3 respectively enclose the peripheries of the LED chips 2. Preferably, a bottom face 31 of the transparent package 3 includes an inner bottom face 31a and an outer bottom face 31b. The inner bottom face 31a and the outer bottom face 31b are level and coplanar. The inner bottom face 31a and the outer bottom face 31b are consistent with the contour of the upper surface 202 of the carrier 200. The transparent package 3 encloses contact faces 33 of the LED chip 2 and is consistent with the contours of the surrounding lateral surface 21, the first surface 22 and the second surface 23 of the LED chip 2. At this moment, perimeters of a plurality of transparent packages 3 jointly form a plurality of wing portions 32, thus the wing portion 32 is formed as a surrounding wing portion surroundingly formed on the periphery the flip-chip LED package structure 300. Therefore, the flip-chip LED package structures 300 can be mutually connected by the surrounding wing portions 32. However, when the flip-chip LED package structures 300 are substantially aligned on the carrier 200 before the following separating process as shown in FIG. 4C, each flip-chip LED package structure 300 has two opposite lateral wing portions 32' respectively formed on the two opposite side thereof, and the flip-chip LED package structures 300 are connected with each other through the lateral wing portions 32'. In the present embodiment, the bottom face 32a of the wing portion 32 (a part of the bottom face 31 of the transparent package 3), the contact point 24a of the chip metalized pad 24, and the upper surface 202 of the carrier 200 are coplanar. However, the abovementioned is only one form of the present embodiment and the present embodiment is not limited thereto.

Figure 5:
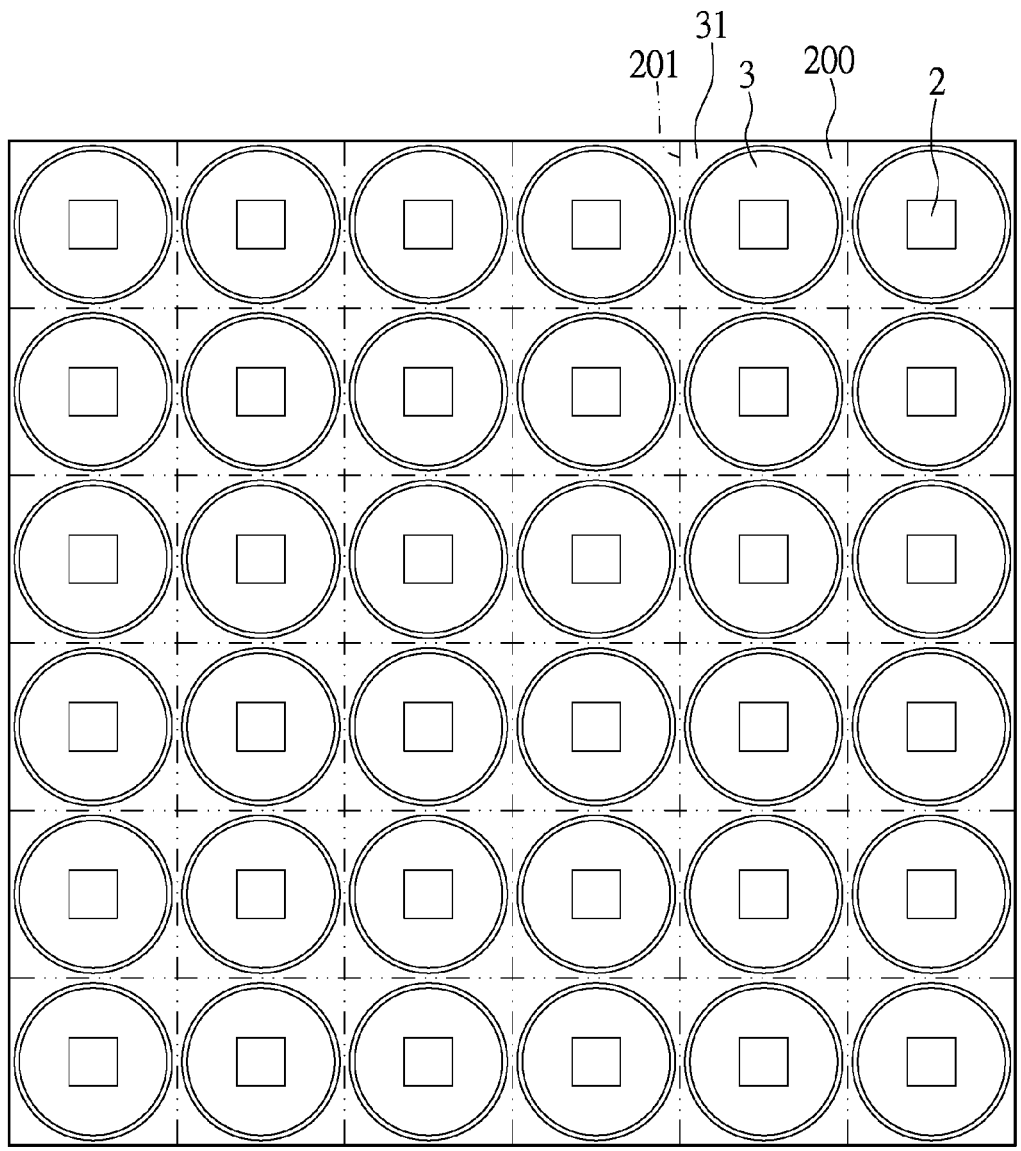
FIG. 5 shows a schematic diagram of the present disclosure during the separating process.

Furthermore, separation marks are introduced for easier procedure in the following step S106. For example, providing predetermined channels in the carrier 200 or forming tunnels on the wing portions 32 between the transparent packages 3 serves as separation channels 201 (as shown in FIG. 5).

Additionally, the carrier 200 can be a flexible thin film such as blue tape, UV tape, gel film or a rigid carrier. The material of the carrier 200 is not limited to the above. The transparent package 3 can be made of silicone, thermosetting gel, epoxy resin, etc. The material of the transparent package 3 is not limited thereto.

In the present embodiment, the formed transparent package 3 is semispherical. However, the shape of the transparent package 3 is not limited thereto. After curing, the transmittance T in the transparent package 3 of light emitted from the LED chip 2 having a wavelength between 300 nm and 950 nm is greater than 60%, and the transmittance T in the transparent package 3 of light emitted from the LED chip 2 having a wavelength between 450 nm and 660 nm is greater than 90%. Transmittance T is defined as the ratio of the intensity of the light coming out of the object I to the intensity of the incident light $I_0$. Namely, transmittance $T=I/I_0$. Additionally, if the LED chip 2 has a lateral wall protection layer 25 (as shown in FIG. 3C) such as silicone oxide or aluminum oxide, then in consideration of efficiency of light emission, the refractive index of the transparent package 3 is preferably close to or smaller than the refractive index of the lateral wall protection layer 25. For example, if the refractive index of the transparent package 3 is 1.5, then the refractive index of the lateral wall protection layer 25 can be 1.45 (refractive index of silicon dioxide) or 1.65 (refractive index of aluminum oxide). Specifically, when the refractive index of the transparent package 3 is k, the suggested refractive index of the lateral wall protection layer 25 is 0.95 k~1.15 k. In other words, light emitted from the LED chip 2 can directly pass through the lateral wall protection layer 25 (as shown in FIG. 3C) and the adjacent transparent package 3, therefore reducing the loss of light due to interlayers.

By using transparent packages 3 to enclose LED chips 2, the present disclosure protects the LEDs chips 2 from ambient temperature, moisture and noise, increasing endurance to weather and mechanical strength. Additionally, the transparent package 3 has optical functions. For example, the transparent packages 3 can have diverse designs, including convex, concave or planar shapes for producing different optical effects, respectively focusing, scattering, or evenly emitting light. By this configuration, the variability of the LED chips 2 is increased, and the luminance and light emission efficiency of the LED chips 2 are improved. Specifically in the present disclosure, the transparent packages 3 are directly packaged on the LED chips 2 and become an integrated body with the LED chips. Therefore, compared to conventional methods of adding another lens on the LED chip 2 to use layers of optical interfaces (two optical lenses) to gather light and increase brightness, the present disclosure uses only a single optical interface (one optical lens) to converge light emitted from the LED chip 2, not only reducing the loss of light but also preventing problems of engagement between the LED chip 2 and the additional lens.

Figure 6:
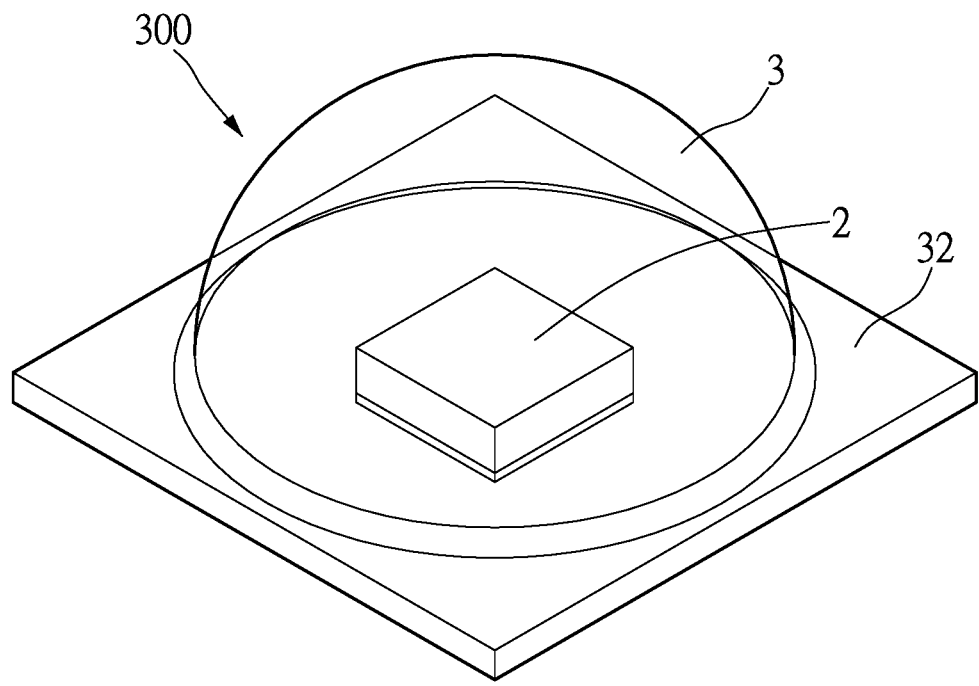
FIG. 6 shows a perspective view of a single flip-chip LED package structure according to the present disclosure.
Figure 7:
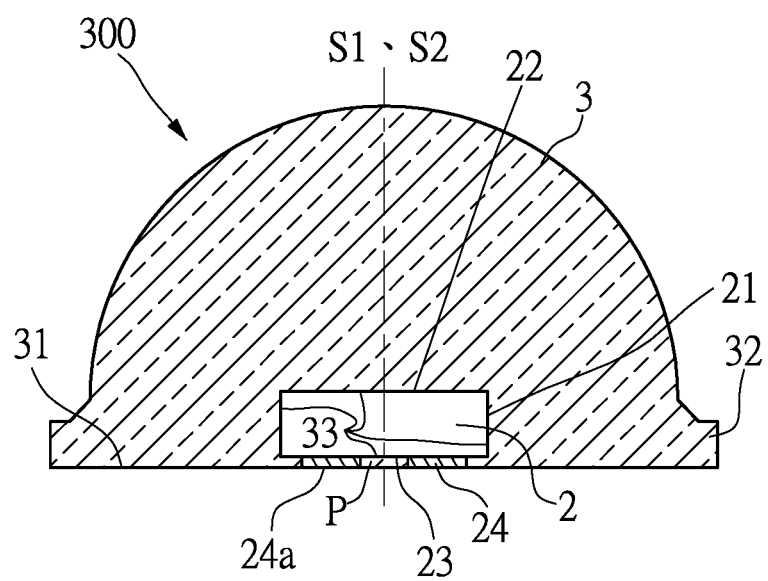
FIG. 7 shows a cross-sectional view of a single flip-chip LED package structure according to the present disclosure.

Next, as shown in step S106, after the transparent packages 3 are integrated with the LED chips 2, a separating process can be carried out. During the separating process, the wing portions 32 or the lateral wing portions 32' between the transparent packages 3 are separated by separating tools along the separation channels 201 on the carrier 200, the separation channels 201 on the wing portions 32 between the transparent packages 3, or separation channels 201 on a separating fixture board (not shown in the figure) surrounding the carrier 200, such that the flip-chip LED package structures 300 are removed from the carrier 200, forming independent single flip-chip LED package structures 300 as shown in FIG. 6. Specifically, the separation channels 201 are defined preemptively on the carrier 200 and are easy to identify due to transparency or semi-transparency of the transparent package 3 or carrier 200. Additionally, the position of the separation channels 201 can be defined between any neighboring regions of the transparent packages 3 during the packaging process. Moreover, the separating process can apply stamping to directly cut on the transparent packages 3. However, the methods of the separating process are not limited to the abovementioned. Referring to FIG. 7 and the plurality of single flip-chip LED package structures 300 obtained after the separating process, the transparent packages 3 can completely enclose the peripheries of the LED chips 2 (including the chip metalized pads 24) and fill up the gaps P. Thus, the contact points 24a of the pair of chip metalized pads of the LED chips 2 are exposed individually from the bottom faces 31 of the transparent packages 3. Moreover, the bottom face 31 of the transparent package 3 and the contact points 24a of the chip metalized pads 24 are coplanar, so the transparent packages 3 can securely hold the peripheries of the LED chips 2 (such as the surrounding lateral surfaces 21, the first surfaces 22 and the second surfaces 23) without detaching, and the single flip-chip LED package structures 300 can serve further in applications in arrangement of array or facing the light source.

Figure 8:
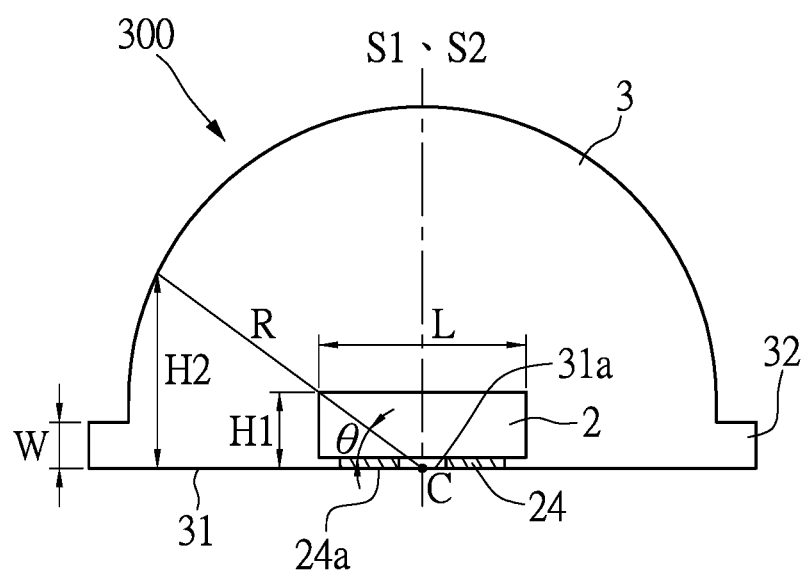
FIG. 8 shows a side view of a single flip-chip LED package structure according to the present disclosure.

On the other hand, the separating process takes a matrix as separated channel 201. Thus, each single flip-chip LED package structures 300 has left over portions of the wing portions 32 due to geometrical discrepancies between the lens type transparent packages 3 and the separated patterns such as rectangular. In consideration of not affecting light emission from the LED chips 2 due to shielding from the wing portions 32, please refer to FIG. 8. The central axis S1 of the transparent package 3 and the central axis S2 of the LED chip 2 are coaxial, and the thickness W of the wing portions 32 is determined by the following formula: $H1<W<H2$, $H2=R*\sin\theta$, $\tan\theta=H1/(L/2)$, wherein H1 is the thickness of the LED chip 2, L is the dimension of the LED chip 2, R is the length of a line segment passing from the center point C of the inner bottom face 31a (in other words, the center point C is located on the horizontal plane including the contact points 24a such that the line connecting the center of the LED chip 2 and the center point C is perpendicular to the horizontal plane including the contact points 24a) through the joint of the lateral surface 21 and the first surface 21 and to the surface of the transparent package 3, and θ is the angle included between the line of length R and the bottom face 31 of the transparent package 3.

As described above, the thickness W of the wing portions 32 is determined by the following formula: $H1<W<H2$, $H2=R*\sin\theta$, $\tan\theta=H1/(L/2)$, wherein H1 is the thickness of the LED chip 2, L is the dimension of the LED chip 2, R is the length of a line segment passing from the center point C of the inner bottom face 31a, through the joint of the lateral surface 21 and the first surface 22, and to the surface of the transparent package 3. Therefore, the wing portions 32 do not affect the light emission efficiency and luminance of the LED chips 2. The hardened transparent packages completely enclose the peripheries of the LED chips 2 and fills up the gaps P. Therefore, the transparent packages 3 can securely hold the LED chips 2 without detaching.

Figure 9A:
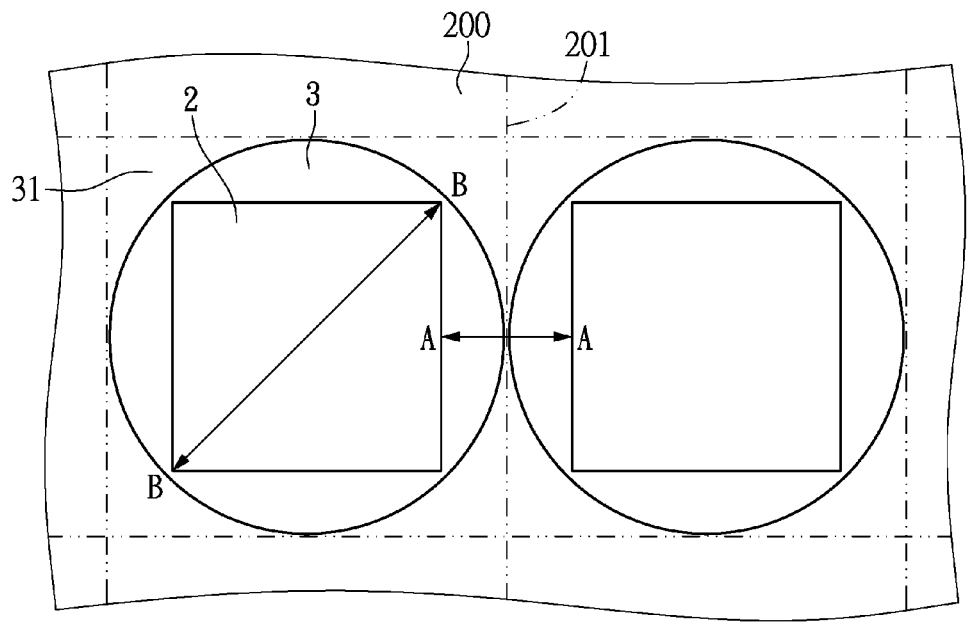
FIGS. 9A-9B show geometrical schematic diagrams of a flip-chip LED structure on a carrier according to the present disclosure.
Figure 9B:
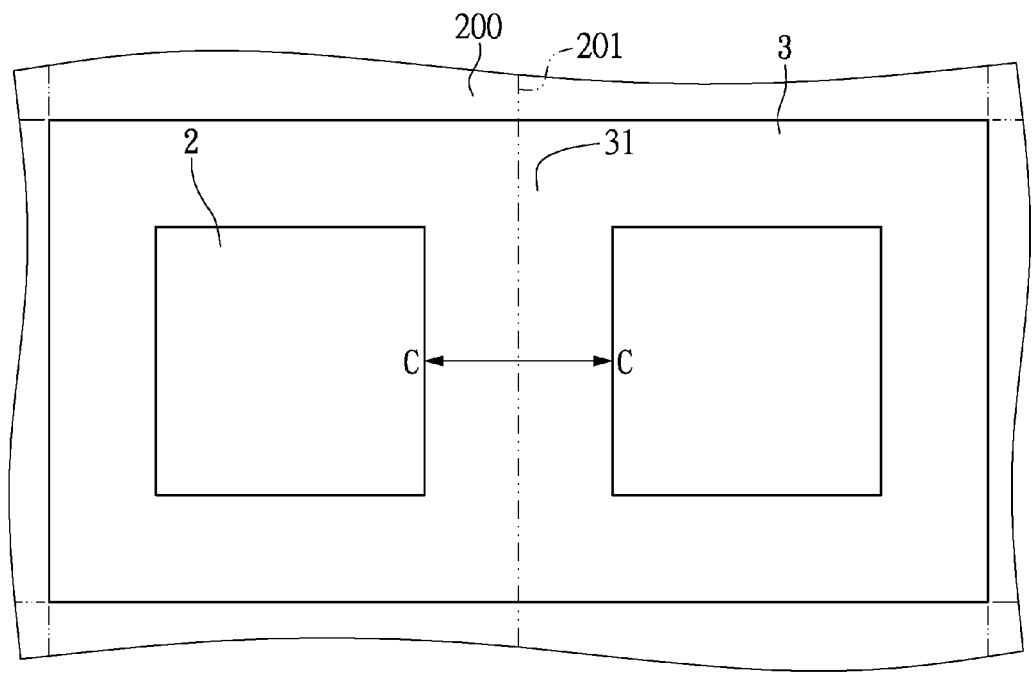

On the other hand, referring to FIG. 9A and FIG. 9B, in consideration of geometrical factors during separating, the distance between the LED chips 2 on the carrier 200 is related to the type of flip-chip LED structures 300. As shown in FIG. 9A, when the flip-chip LED package structures 300 are of lens-type, in consideration of the spherical transparent packages 3, the distance AA between any two LED chips 2 on the carrier 200 is greater than or equal to 40% of the distance BB of the diagonal of each LED chip 2, in order to successfully separate single flip-chip LED package structures 300. As shown in FIG. 9B, in consideration of equal height between the transparent packages 3 and the wing portions 32, e.g. the transparent packages 3 are square-shaped (the four edges of the transparent package 3 respectively correspond to and are parallel to the four edges of the LED chip 2), the distance CC between any two LED chips 2 on the carrier 200 must be greater than 0.1 mm in order to preserve space for successful separating by laser.

Figure 10A:
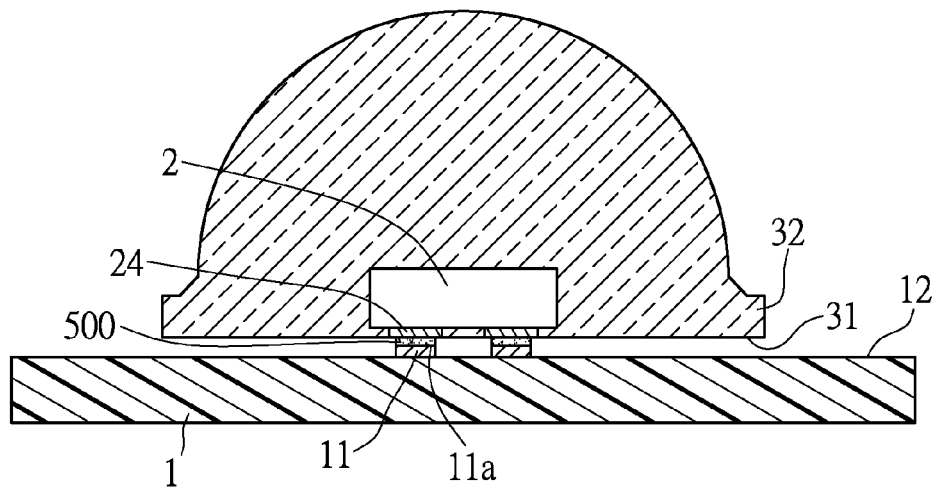
FIGS. 10A-10B show a schematic diagram of the present disclosure after being heated in the bonding process.
Figure 10B:
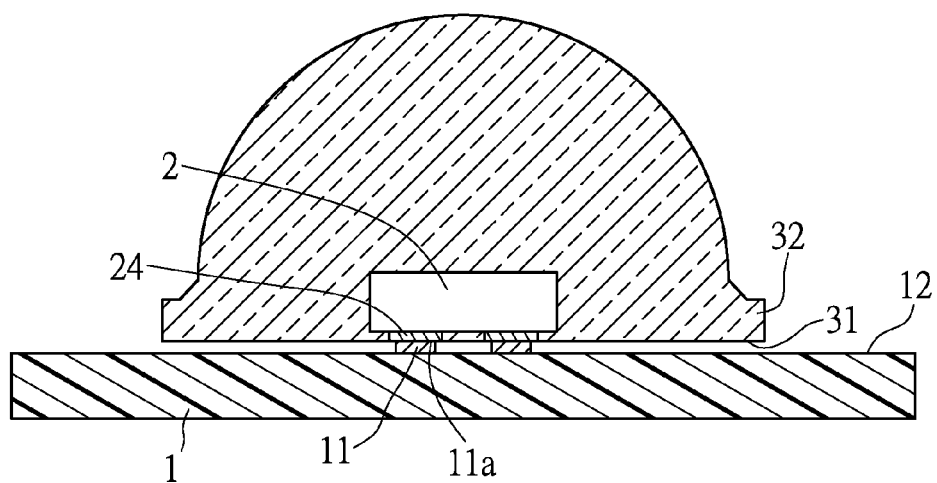

Finally, as shown in step S108, a bonding process is carried out. Referring to FIGS. 10A and 10B, the flip-chip LED package structure 300 does not contact the circuit board 1. At least one flip-chip LED package structure 300 is attached to a circuit board 1 to form the flip-chip LED package module 100 The bottom faces 31 of the transparent packages 3 of the flip-chip LED package structures 300 are separate from the circuit board 1. Specifically, the method of bonding the flip-chip LED package structures 300 and the circuit board 1 can directly bond and electrically connect the respective pair of the chip metalized pads 24 of the LED chips 2 to the electrical contact pads 11 on the circuit board 1 via solder 500. For example, as shown in FIG. 10A, when the solder 500 is solder, the bonding process of the present disclosure is a surface mount technology process (SMT), which disposes solder 500 on the electrical contact pads 11 of the circuit board 1, disposes the flip-chip LED package structure 300 on the circuit board 1, and then through reflow, namely heating the circuit board 1 in a furnace, cures the solder 500, thus, bonding the chip metalized pads 24 of the flip-chip LED package structure 300 and the electrical contact pads 11 of the circuit board 1. The material of the solder 500 can be gold, nickel, tin, gold-tin alloy, silver-tin alloy, gold-germanium alloy, indium, etc.

As mentioned above, the present disclosure eliminates chip bonding and wiring process. Namely, the LED chips 2 and the circuit board 1 does not need an additional substrate therebetween, thereby eliminating a layer of heat resistance such that the heat resistance after packaging is reduced, in turn reducing the operating temperature and increasing the light emission efficiency of the LED chips 2. Specifically, the present disclosure directly solders the flip-chip LED package structures 300 to the circuit board 1 and forms the flip-chip LED package modules 100. The heat resistance comes only from a layer of solder 500 (FIG. 10A) between the LED chips 2 and the circuit board 1, and since solder 500 is a good heat conductor, thus, the heat source of the chips can be effectively transferred out, providing preferred heat dissipation. Additionally, flip-chip packaging (packaging process and bonding process) eliminates the cost of gold wiring and the possible disconnection thereof. Moreover, since the flip-chip LED package structures 300 taken from the carrier 200 are single independent units, the flip-chip light emitting package structures 300 can be quickly disposed on the circuit board 1 by surface mount technology. Therefore, automated mass production is possible and production as well as labor costs are greatly reduced.

Additionally, in the present embodiment, the surface areas of the chip metalized pads 24 are greater than or equal to the surface area of the electrical contact pads 11. Therefore, when the solder 500 is soldering tin, given the same pad pitch (gap P) between the chip metalized pads 24, the pad width of the electrical contact pads 11 is reduced, and the space (>=P) between neighboring electrical contact pads 11 is increased, effectively preventing solder 500 from spreading during bonding process and contacting each other, which causes short circuit or unevenness of solder 500. Additionally, the top faces 11a of the electrical contact pads 11 are higher than the solder-resisting layer 12 of the circuit board 1, effectively preventing the solder 500 from spreading due to compression and flowing onto the circuit board 1 during bonding process, which causes short circuit.

As mentioned above, the present disclosure has the following advantages. The LED chips and the circuit board of the present disclosure do not have a layer of substrate therebetween. A layer of heat resistance is eliminated, such that after packaging the heat resistance is reduced, thereby reducing operating temperature and increasing light emission efficiency. Since the flip-chip LED structure of the present disclosure is a single independent unit, the flip-chip light emitting package structures can be quickly disposed on the circuit board by surface mount technology. Therefore, automated mass production is possible and production as well as labor costs are greatly reduced. The surface area of each of the electrical contact pads is smaller than the surface area of the respective chip metalized pad, effectively preventing the solder from expanding during soldering and contacting each other, which causes short circuit or unevenness of the solder. The top faces of the electrical contact pads are higher than the solder-resisting layer of the circuit board, effectively preventing the solder from expanding due to compression during soldering and flowing onto the circuit board, which causes short circuit.

Figure 11A:
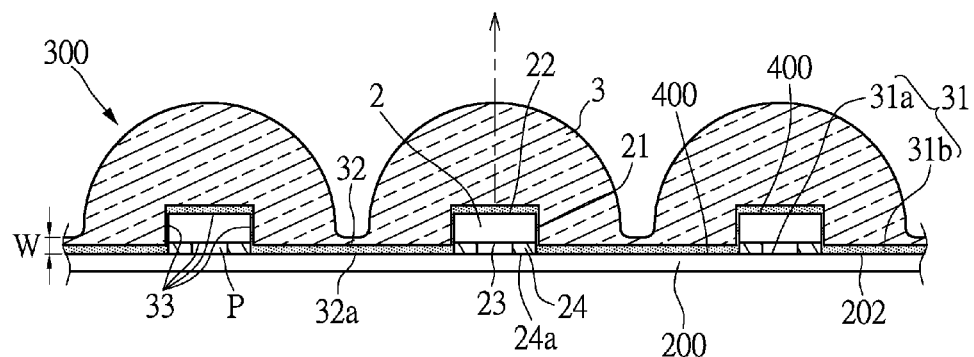
FIG. 11A shows a schematic diagram of the present disclosure during the coating process.
Figure 11B:
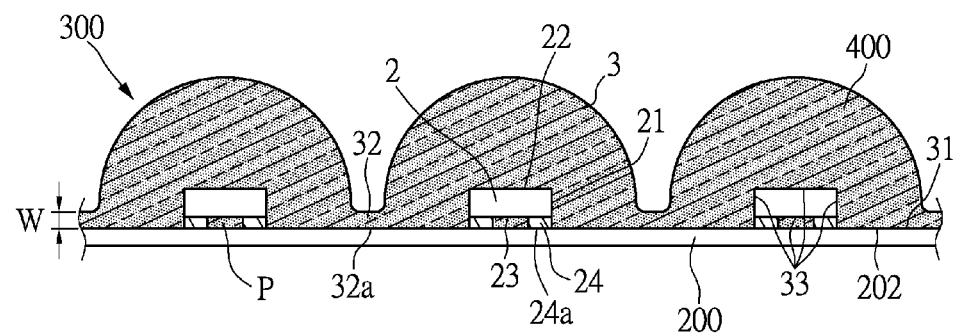
FIG. 11B shows a schematic diagram of the present disclosure during the doping process.
Figure 12A:
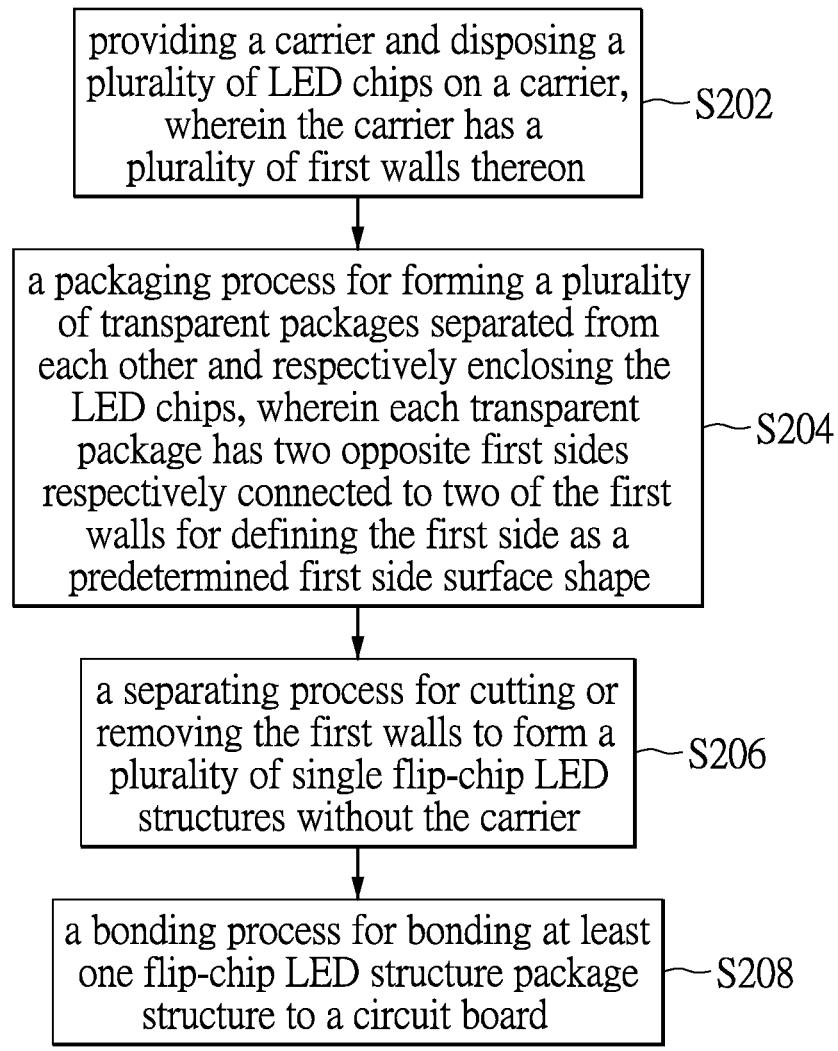
FIG. 12A shows a flowchart of the production method of a flip-chip LED package module according to the present disclosure (3)
Figure 12B:
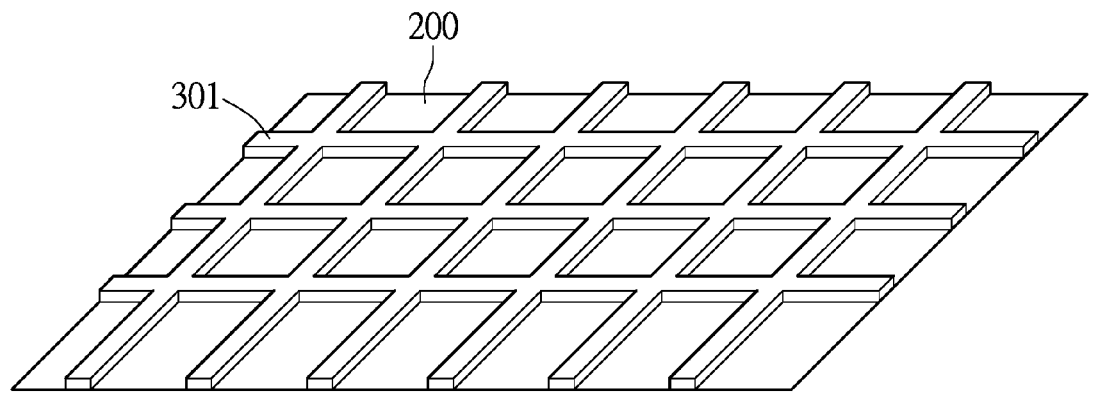
FIG. 12B shows a schematic diagram of walls dispensed on a carrier according to an embodiment of the present disclosure.
Figure 12C:
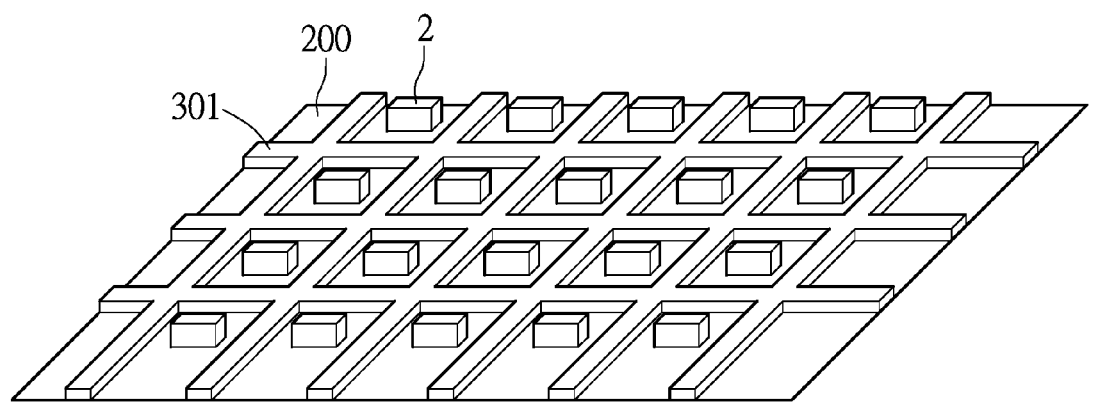
FIG. 12C shows a schematic diagram of LED chips disposed within the walls of FIG. 12B according to an embodiment of the present disclosure.
Figure 12D:
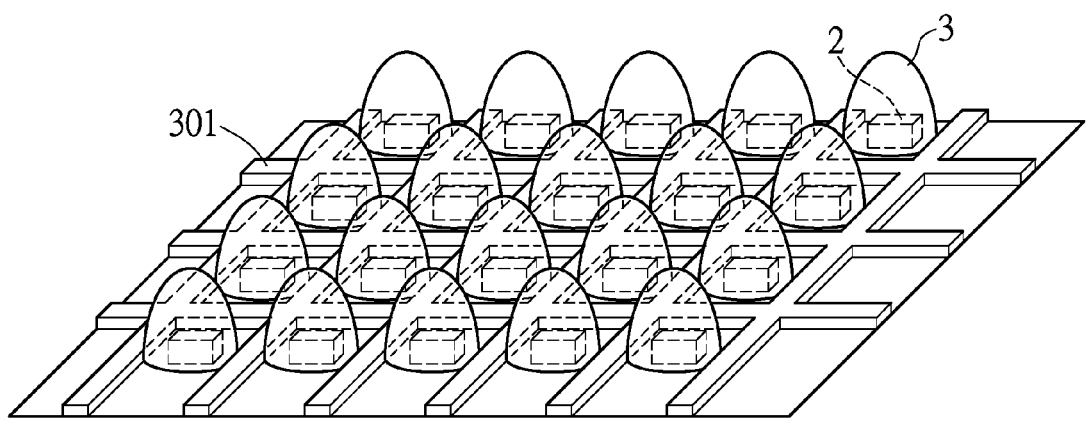
FIG. 12D shows a schematic diagram of the LED chips of FIG. 12C enclosed in transparent packages according to an embodiment of the present disclosure.

Additionally, as shown in FIG. 10B, when the soldering material is a flux (not labeled), the flux is disposed between the chip metalized pads 24 and the electrical contact pads 11, and then the circuit board 1 is placed in a high temperature furnace for heating. During the bonding process of the present disclosure, the flip-chip light structures 300 are disposed on the LED package on the circuit board 1. Through the effect of the flux, the chip metalized pads 24 and the electrical contact pads 11 are soldered. During the heating process, the flux evaporates. After heating, the flux is no longer between the chip metalized pads 24 and the electrical contact pads 11. In other words, the chip metalized pads 24 and the electrical contact pads 11 are directly bonded. Therefore, the heat produced by the LED chip 2 during operation can be directly transferred to the circuit board 1 and dissipated to the ambience, such that the heat dissipation is greatly improved, the temperature effectively is reduced, and the light emission efficiency as well as the life time of the chip is increased. Please refer to FIG. 2B, FIG. 11A and FIG. 11B. A step S103 can be added between the abovementioned step S102 and step S104, in which a coating process or a doping process is carried out. As shown in FIG. 11A, during the coating process, a fluorescent material 400 can be coated on the carrier 200 and the LED chips 2, or selectively coated only on the LED chips 2 so as to form a fluorescent layer or a patterned phosphor layer. As shown in FIG. 11B, during the doping process, fluorescent material 400 is doped in the liquid transparent gel to form a fluorescent transparent package structure 3. Specifically, the coating process can be carried out by a spray coating device. First, fill the spray coating device with fluorescent material 400. Then, through the nozzle of the spray coating device, spray coat the fluorescent material 400 on the LED chips 2 and the upper surface 202 of the carrier 200, such that the fluorescent material 400 is evenly covering the upper surface 202 of the carrier 200 and the surrounding lateral surface 21 and the first surface 22 of the LED chips 2, or selectively coated on the LED chips 2 only, such that the fluorescent material 400 only covers the surrounding lateral surface 21 and the first surface 22 of the LED chips 2. Afterward, a heating step hardens the fluorescent material 400 into a fluorescent layer or a patterned phosphor layer. As shown in FIG. 11A, when carrying out the packaging process after the coating process, phosphor layers can be adhered to the bottom faces 31 of the transparent packages 3 (the faces facing the upper surface 202 of the carrier 200). Specially, when the phosphor layers adheres to the entire outer bottom surfaces 31b of the transparent packages 3, interference of light emission from the LED chips 2 through the bottom faces 31 is reduced, and light emission in the front direction (as shown by the arrow in FIG. 11A) is increased. Additionally, if the LED chips 2 each have a lateral wall protection layer 25 (as shown in FIG. 3C), the proportion of phosphor adhered onto the surrounding lateral surfaces 21 of the LED chips 2 is increased. Additionally, referring to FIG. 11B, during the doping process, phosphor 400 for adjusting lighting color can be directly doped in a liquid transparent gel, forming the transparent packages 3 via the liquid transparent gel. However, the abovementioned is only one embodiment of the present disclosure and the present disclosure is not limited thereto.

Referring to FIGS. 12A-14E. According to another embodiment of the present disclosure, in step S202, a temporary carrier 200 includes walls 301 having first walls 3011 and second walls 3012 formed as a matrix and disposed on the separation channels 201 as shown in FIG. 12B. More specifically, the step S202 includes providing a temporary carrier 200 and disposing a plurality of LED chips 2 on a carrier 200, wherein the carrier 200 has a plurality of first walls 3011 and second walls 3012 thereon. The method of disposing walls 301 on the position of the carrier 200 can be gel dispensing, molding, etc. and is not limited thereto. The walls 301 may use the same material of the liquid transparent gel. Furthermore, the walls 301 may be formed as reflective elements, such as white dielectric for example, the same material of the liquid transparent gel with $TiO_2$ additive. However, the material of the walls 301 is not limited thereto. Moreover, the shape of the walls 301 may be rectangle, semispherical, etc. and is not limited thereto. Specifically, as shown in FIG. 13A, the first walls 3011 and second walls 3012 can be arranged perpendicular to each other to define cells, and each of the cells contains at least one LED chip 2. Alternately, please refer to FIG. 14A, in another embodiment, the walls 301 having the first walls 3011 can be arranged in parallel to define rows, and each of the rows includes a plurality of LED chips 2.

In step S204 and referring to FIGS. 12D and 13A-14E, providing a packaging process for forming a plurality of transparent packages 3 separated from each other and respectively enclosing the LED chips 2. Each transparent package 3 has two opposite first sides 34 respectively connected to two of the first walls 3011 for defining the first side 34 as a predetermined first side 34 surface shape. In addition, the carrier 200 may also have a plurality of second walls 3012 thereon, and each transparent package 3 has two opposite second sides 35 respectively connected to two of the second walls 3012 for defining the second side 35 as a predetermined second side 35 surface shape. Therefore, through the walls 301, the transparent packages 3 corresponding to and enclosing the LED chips 2 are formed limited within the region defined by the disposing walls 301 individually. In particularly, the two first walls 3011 and the two second walls 3012 are alternately connected to form a surrounding frame for defining a periphery of the transparent package 3 as a predetermined periphery surface shape. In other word, the profile of the transparent package 3 contours to fit the inner profile of the neighboring walls 301. The first walls 3011 and second walls 3012 on the separation channels ensure that adjacent transparent packages 3 do not contact each other during gel dispensing of the transparent packages 3. Specifically, referring to FIGS. 13A-13E, if first walls 3011 and second walls 3012 are perpendicularly disposed on the predetermined position of the separation channels 201, then each of the transparent packages 3 is abutted on four sides (3a, 3b, 3c, 3d) respectively by first walls 3011 and second walls 3012 and the four sides (3a, 3b, 3c, 3d) are matching inner surface defining by the first walls 3011 and second walls 3012. Furthermore, as shown in FIG. 13B, the transparent package 3 is flat on all four sides (3a, 3b, 3c, 3d). The four corners of each of the transparent package 3 are curved. In the other words, the transparent package 3 has no sharp cornered rectangular or square shape. Alternately, referring to FIGS. 14A-14E, if one set of parallel first walls 3011 is disposed on the separation channels 201, and then each of the transparent packages 3 is abutted on two sides (3a, 3b) respectively by two of the first walls 3011 and is flat on those two sides (3c, 3d). The other two sides (3a, 3b) of each of the transparent package 3 are curved. Thus, the transparent package 3 has a capsulate shape as shown in the plan view of FIG. 14B. In addition, when a plurality of transparent packages 3 are corresponding to and enclosing the LED chips 2, the curvatures of transparent packages 3 are not only dependent on the material of the liquid transparent gel, but also affected from the area which is defined by the walls 301. For example, the greater the area, the smaller the curvature of transparent packages 3 will be. The smaller the area, the greater the curvature of transparent packages 3 will be.

Figure 13A:
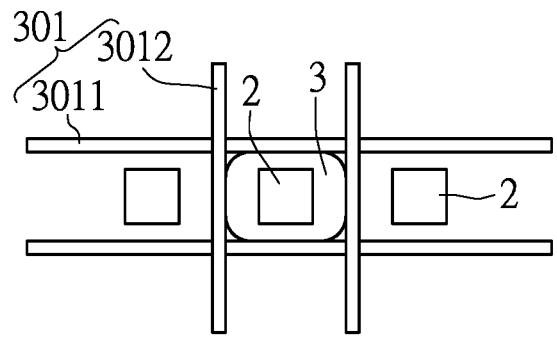
FIG. 13A shows a top view of single flip-chip LED package structure of FIG. 12B disposed within the walls according to an embodiment of the present disclosure.
Figure 13B:
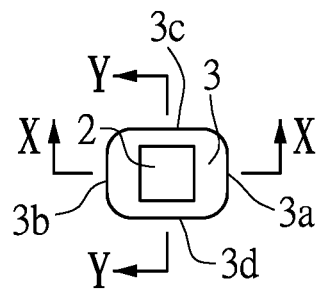
FIG. 13B shows a top view of single flip-chip LED package structure of FIG. 12B without the walls according to an embodiment of the present disclosure.
Figure 13C:
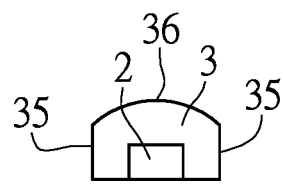
FIG. 13C shows a cross-sectional view taken along the section line X-X of FIG. 13B.
Figure 13D:
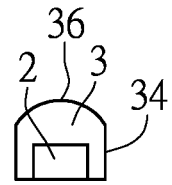
FIG. 13D shows a cross-sectional view taken along the section line Y-Y of FIG. 13B.

In step S206, the transparent packages 3 are separated by separating tools along the separation channels 201 or the walls 301 thereon. In particularly, providing a separating process for cutting or removing the walls 301 to form a plurality of single flip-chip LED structures 300 without the carrier 200. As shown in FIGS. 13C-13D, the first walls 3011 and the second walls 3012 are both removed through the separating process, each flip-chip LED package structure 300 has two opposite first sides 34 and two opposite second sides 35. The two opposite first sides 34 respectively formed of two substantially flat surfaces and a top side 36 formed of one of a substantially curved surface and a substantially semicircular surface, and the top side 36 is connected between the two first sides 34. The two opposite second sides 35 respectively formed of two substantially flat surfaces, the top side 36 is connected between the two second sides 35, the two first sides 34 and the two second sides 35 are alternately connected to form a periphery of the flip-chip LED package structure 300. FIG. 13C shows a cross-sectional view taken along the section line X-X of FIG. 13B; FIG. 13D shows a cross-sectional view taken along the section line Y-Y of FIG. 13B. When first walls 3011 and second walls 3012 are perpendicularly disposed on the carrier 200, the shape of first side 34 and second side 35 will adapted to the walls 301.

Figure 13E:
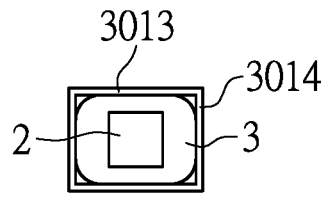
FIG. 13E shows a top view of single flip-chip LED package structure of FIG. 12B including the partial of walls according to an embodiment of the present disclosure.
Figure 14A:
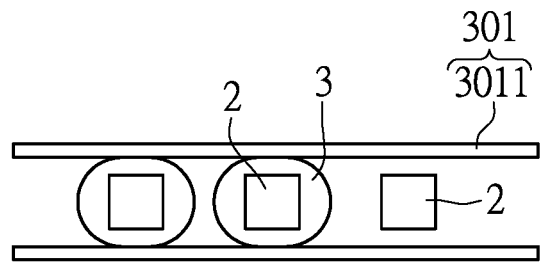
FIG. 14A shows a top view of single flip-chip LED package structure of FIG. 12B disposed within the walls according to another embodiment of the present disclosure.
Figure 14B:
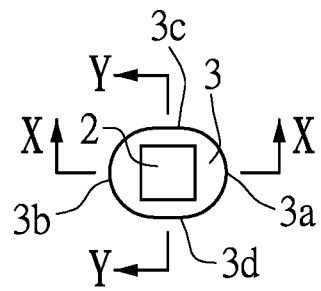
FIG. 14B shows a top view of single flip-chip LED package structure of FIG. 12B without the walls according to another embodiment of the present disclosure.
Figure 14C:
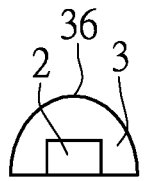
FIG. 14C shows a cross-sectional view taken along the section line X-X of FIG. 14B.
Figure 14D:
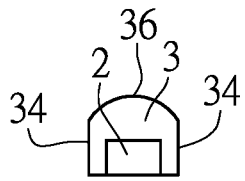
FIG. 14D shows a cross-sectional view taken along the section line Y-Y of FIG. 14B.
Figure 14E:
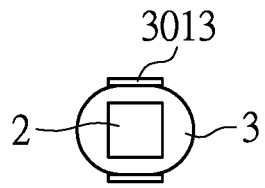
FIG. 14E shows a top view of single flip-chip LED package structure of FIG. 12B including the partial of walls according to another embodiment of the present disclosure.

As shown in FIGS. 14C-14D, in the other embodiment, the flip-chip LED package structure 300 has two opposite first sides 34 respectively formed of two substantially flat surfaces and a top side 36 formed of one of a substantially curved surface and a substantially semicircular surface, and the top side 36 is connected between the two first sides 34. As shown in FIGS. 14C-14D, FIG. 14C and FIG. 14D show cross-sectional views taken along the section line X-X and Y-Y of FIG. 14B, individually. Through the first walls 3011 abutting on the sides (3c, 3d), the shape of sides (3c, 3d) will be adapted to the shape of the first walls 3011 and the shape of the other sides (3a, 3b) will be not defined by the first walls 3011. However, after the separating process, the first sides 34 and the second side 35 may be perpendicular to the carrier 200 or not. The first sides 34 and the second side 35 may be an incline surface. Thus, the transparent package 3 having a bottom part in a form of reversed trapezoid with no sharp corner may be formed. In addition, in the other embodiments of the separating process, FIG. 13E shows an embodiment of that each first wall 3011 that is cut to formed a first dam 3013 and each second wall 3012 is cut to formed a second dam 3014, wherein the two first sides 34 of each transparent package 3 are respectively connected to two of the first dams 3013, and the two second sides 35 of each transparent package 3 are respectively connected to two of the second dams 3014. FIG. 14E shows the other embodiment of that each first wall 3011 are cut to formed a first dam 3013, wherein the two first sides 34 of each transparent package 3 are respectively connected to two of the first dams 3013. In other words, the first dam 3013 and second dam 3014 are formed by the first walls 3011 and second walls 3012. The first dam 3013 and second dam 3014 may be used to be the reflecting element of the transparent package 3. Furthermore, after the separating process, the first dam 3013 and second dam 3014 may be an incline surface. Thus, the transparent package 3 combined dams may have a bottom part in a form of reversed trapezoid with no sharp corner. In the present embodiment, the formed transparent package 3 is semispherical. However, the shape of the transparent package 3 is not limited thereto. The transparent packages 3 can have diverse designs, including convex, concave or planar shapes for producing different optical effects, respectively focusing, scattering, or evenly emitting light. Other processes of this embodiment are similar to the processes of the aforementioned embodiments and are not further detailed herein.

Finally, as shown in step S208, a bonding process is carried out. Referring to FIGS. 13B-13E, FIGS. 14B-14E and 10A-10B again, the flip-chip LED package structure 300 does not contact the circuit board 1. At least one flip-chip LED package structure 300 is attached to a circuit board 1 to form the flip-chip LED package module 100. The bottom faces 31 of the transparent packages 3 of the flip-chip LED package structures 300 are separate from the circuit board 1.

The descriptions illustrated supra set forth simply the preferred embodiments of the present disclosure; however, the characteristics of the present disclosure are by no means restricted thereto. All changes, alternations, or modifications conveniently considered by those skilled in the art are deemed to be encompassed within the scope of the present disclosure delineated by the following claims.

What is claimed is:
1. A method of manufacturing a flip-chip LED package module, comprising the following steps:
disposing a plurality of LED chips on a temporary carrier, which temporarily supports the plurality of LED chips;
a packaging process, forming a plurality of transparent packages connected with each other and respectively enclosing the LED chips;
a separating process, separating the transparent packages from each other to form a plurality of single flip-chip LED structures without the temporary carrier, wherein the separating process includes completely removing the temporary carrier; and
a bonding process, bonding at least one of the flip-chip LED structures to a circuit board having a top surface with a plurality of electrical contact pads, wherein a bottom surface of the transparent package of the flip-chip LED structure faces the top surface of the circuit board, and wherein the LED chip has at least a pair of chip metalized pads exposed from the bottom surface to be connected with the electrical contact pads.

2. The method according to claim 1, wherein each of the LED chips has a surrounding lateral surface, a first surface and a second surface opposite the first surface, the surrounding lateral surface is adjacent to the first surface and the second surface, the second surface has at least one pair of chip metalized pads, the at least one pair of chip metalized pads has a gap, and wherein the packaging process comprises enclosing the surrounding lateral surfaces, the first surfaces and the second surfaces of the LED chips, and filling the gaps by the transparent packages.

3. The method according to claim 2, wherein the packaging process comprises forming a flat bottom surface of the transparent packages coplanar with a contact point of each of the chip metalized pads and the upper surfaces of the carrier.

4. The method according to claim 2, wherein when the transparent packages are lens-shaped, the positions of the arranged LED chips have predetermined distances therebetween greater than or equal to 40% of the length of the diagonal of each of the LED chips, or when the transparent packages and the neighboring wing portions are of level height, the positions of the arranged LED chips have predetermined distances therebetween greater than 0.1 millimeter.

5. The method according to claim 4, wherein the thickness W of the wing portions is determined by the following formula: $H1<W<H2$, $H2=R*\sin\theta$, $\tan\theta=H1/(L/2)$, wherein H1 is the thickness of the LED chip, L is the dimension of the LED chip, R is the length of a line segment passing from the center point of the inner bottom face through the joint of the lateral surface and the first surface and to the surface of the transparent package, and $\theta$ is the included angle between the line of length R and the bottom face of the transparent package.

6. The method according to claim 2, further comprising a coating process or a doping process before the packaging process, wherein the coating process comprises spray coating a fluorescent material on the LED chips and heating the fluorescent material to form a fluorescent layer on the LED chips, and wherein the doping process comprises doping a fluorescent material in a liquid transparent gel.

7. The method according to claim 6, wherein the packaging process further comprises providing a mold with a plurality of mold cavities, disposing respectively the LED chips of the carrier in the corresponding mold cavities of the mold, injecting the liquid transparent gel into the mold cavities, and then curing the transparent packages.

8. The method according to claim 1, wherein the separating process comprising separating the wing portions along separation channels on the carrier, separation channels between the transparent packages, or a separation channel on a separating fixture board surrounding the carrier.

9. The method according to claim 2, wherein the bonding process further comprises:
providing the circuit board with a plurality of electrical contact pads higher than a solder-resisting layer of the circuit board, wherein the surface area of each of the electrical contact pads is smaller than the surface area of the corresponding chip metalized pads;
bonding the at least one flip-chip LED structure to the circuit board by soldering the chip metalized pads and the corresponding electrical contact pads so as to expose the bottom surface of the transparent package of the flip-chip LED structure.

10. The method according to claim 1, wherein each flip-chip LED structure has a surrounding wing portion surroundingly formed on the periphery thereof, and the flip-chip LED structures are connected with each other through the surrounding wing portions.

11. The method according to claim 1, wherein each flip-chip LED structure has two opposite lateral wing portions respectively formed on the two opposite side thereof, and the flip-chip LED structures are connected with each other through the lateral wing portions.

12. A method of manufacturing a flip-chip LED package module, comprising the following steps:
disposing a plurality of LED chips on a carrier, wherein the carrier has a plurality of first walls thereon;
a packaging process, forming a plurality of transparent packages separated from each other and respectively enclosing the LED chips, wherein each transparent package has two opposite first sides respectively connected to two of the first walls for defining the first side as a predetermined first side surface shape;
a separating process, cutting or removing the first walls to form a plurality of single flip-chip LED structures without the carrier; and
a bonding process, bonding at least one flip-chip LED structure to a circuit board.

13. The method according to claim 12, wherein the carrier has a plurality of second walls thereon, and wherein in the packaging process each transparent package has two opposite second sides respectively connected to two of the second walls for defining the second side as a predetermined second side surface shape.

14. The method according to claim 13, wherein in the packaging process, the two first walls and the two second walls alternately connected to form a surrounding frame for defining a periphery of the transparent package as a predetermined periphery surface shape.

15. The method according to claim 12, wherein in the separating process each first wall being cut to form a first dam, and wherein the two first sides of each transparent package are respectively connected to two of the first dams.

16. The method according to claim 15, wherein in the separating process, each first wall being cut to form a first dam and each second wall being cut to form a second dam, and wherein the two first sides of each transparent package are respectively connected to two of the first dams, and the two second sides of each transparent package are respectively connected to two of the second dams.

17. The method according to claim 13, wherein each of the LED chips has a surrounding lateral surface, a first surface and a second surface opposite the first surface, the surrounding lateral surface is adjacent to the first surface and the second surface, the second surface has at least one pair of chip metalized pads, the at least one pair of chip metalized pads has a gap, and wherein the packaging process comprises enclosing the surrounding lateral surfaces, the first surfaces and the second surfaces of the LED chips and filling the gaps by the transparent packages.

18. The method according to claim 17, wherein the bonding process further comprises:
providing the circuit board with a plurality of electrical contact pads higher than a solder-resisting layer of the circuit board, wherein the surface area of each of the electrical contact pads is smaller than the surface area of the corresponding chip metalized pads; and
bonding the at least one flip-chip LED structure to the circuit board by soldering the chip metalized pads and the corresponding electrical contact pads so as to expose a bottom surface of the transparent package of the flip-chip LED structure.

19. The method according to claim 17, further comprising a coating process before the packaging process, wherein the coating process comprises:
- spray coating a fluorescent material on the LED chips; and
- heating the fluorescent material to form a fluorescent layer on the LED chips.

20. The method according to claim 17, further comprising doping a fluorescent material in a liquid transparent gel before the packaging process, wherein the packaging process further comprises curing the liquid transparent gel with the fluorescent material to form the plurality of fluorescent transparent packages.

* * * * *